(12) United States Patent
Kunii

(10) Patent No.: US 11,013,134 B2
(45) Date of Patent: May 18, 2021

(54) SEAL STRUCTURE OF POWER CONTROL UNIT

(71) Applicant: HONDA MOTOR CO., LTD., Tokyo (JP)

(72) Inventor: Hiroshi Kunii, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 16/796,984

(22) Filed: Feb. 21, 2020

(65) Prior Publication Data
US 2020/0275571 A1 Aug. 27, 2020

(30) Foreign Application Priority Data
Feb. 26, 2019 (JP) .............................. JP2019-032718

(51) Int. Cl.
| H05K 5/06 | (2006.01) |
| H05K 7/20 | (2006.01) |
| B60R 16/02 | (2006.01) |
| H01R 9/22 | (2006.01) |
| B60R 16/03 | (2006.01) |

(52) U.S. Cl.
CPC ......... H05K 5/069 (2013.01); B60R 16/0215 (2013.01); B60R 16/03 (2013.01); H01R 9/223 (2013.01); H05K 5/061 (2013.01); H05K 7/20872 (2013.01); H05K 7/20927 (2013.01)

(58) Field of Classification Search
CPC ............... B60L 15/007; B60R 16/0215; B60R 16/0239; B60R 16/03; H05K 5/061; H05K 5/069; H05K 7/20872; H05K 7/20927
See application file for complete search history.

(56) References Cited

U.S. PATENT DOCUMENTS

| 9,293,856 | B2 * | 3/2016 | Shigeta ............ H01R 13/5202 |
| 9,947,435 | B2 * | 4/2018 | Oka ...................... H02G 15/04 |
| 10,023,136 | B2 * | 7/2018 | Oka ...................... H01B 7/0063 |
| 10,196,017 | B2 * | 2/2019 | Oka ...................... H01B 7/0063 |
| 10,290,974 | B2 * | 5/2019 | Ishibashi ................ H02K 5/225 |
| 2020/0227907 | A1 * | 7/2020 | Iizuka .................... H02G 15/04 |
| 2020/0274420 | A1 * | 8/2020 | Kunii ....................... H01B 5/02 |
| 2020/0274424 | A1 * | 8/2020 | Kunii ..................... H02K 11/33 |

FOREIGN PATENT DOCUMENTS

JP    2016-139540    8/2016

* cited by examiner

*Primary Examiner* — Robert J Hoffberg
(74) *Attorney, Agent, or Firm* — Amin, Turocy & Watson, LLP

(57) ABSTRACT

A power control unit includes a power module, a water jacket, and a power supply connection module. The water jacket has a through hole passing through the water jacket from one side surface thereof to the other side surface thereof. The power supply connection module includes a connection conductor passing through the through hole and configured to connect an internal power supply path to an external power supply path and a conductor housing configured to hold at least a part of the periphery of the connection conductor on the external power supply path side. A seal member configured to seal the periphery of the through hole is disposed between the water jacket and the conductor housing.

5 Claims, 11 Drawing Sheets

SEAL STRUCTURE OF POWER CONTROL UNIT

CROSS-REFERENCE TO RELATED APPLICATION

Priority is claimed on Japanese Patent Application No. 2019-032718, filed Feb. 26, 2019, the content of which is incorporated herein by reference.

BACKGROUND OF THE INVENTION

Field of the Invention

The present invention relates to a seal structure of a power control unit connected to a motor unit.

Description of Related Art

Power control units which are directly coupled to a motor unit installed in a vehicle are known. Power control units include built-in modules having functions such as inverters and boost converters configured to drive/regenerate motors. A power supply connection module configured to connect a three-phase power supply path on the motor unit side to a three-phase power supply path on the power module side is provided between a motor unit and a power control unit (for example, refer to Japanese Unexamined Patent Application, First Publication No. 2016-139540).

This type of power supply connection module includes a connection conductor such as a bus bar configured to connect a power supply path for each phase on the motor unit (hereinafter referred to as an "external power supply path") to a power supply path for a corresponding phase on the power module side (hereinafter referred to as an "internal power supply path") and a resin conductor housing configured to hold the connection conductor. For example, the conductor housing is fixed to the motor unit side and a part of the conductor housing is disposed inside a lower case through the through holes of the lower case of the power control unit when the power control unit is attached to the motor unit. An end portion of the connection conductor held in the conductor housing is connected to the internal power supply path inside the lower case.

Also, in the power control unit having the above-described power supply connection module adopted therein, the through holes through which a part of the conductor housing in the power supply connection module and the connection conductor are inserted into the lower case are formed in a wall of the lower case. Furthermore, when a gap is formed between the through hole and the conductor housing, since there is a concern about dust and dirt entering a block of the power control unit, a seal member is disposed between the conductor housing and a circumferential region portion of the through hole in the lower case.

SUMMARY OF THE INVENTION

In the above-described conventional seal structure of the power control unit, the seal member is disposed between the conductor housing configured to hold the connection conductor and an outer wall of the power control unit (the lower case). For this reason, when heat is generated in the connection conductor when a high-voltage current flows therethrough, the heat is easily transmitted to the seal member through the conductor housing. Furthermore, when the transmission of high-temperature heat to the seal member continues for a long time, there is a concern about the deterioration of the seal member. In addition, when heat is generated in the connection conductor, the heat is transmitted to the resin conductor housing. Thus, the conductor housing needs to be made of an expensive resin having high heat resistance, which easily causes a product cost.

An aspect according to the present invention was made in consideration of such circumstances, and an object of the present invention is to provide a seal structure of a power control unit capable of efficiently radiating heat of a connection conductor to the outside and preventing a decrease in durability of a conductor housing and a seal member.

In order to accomplish the associated object by solving the above-mentioned problems, the present invention employs the following aspects.

(1) A seal structure of a power control unit according to an aspect of the present invention includes: a power module; a water jacket in which the power module is disposed on one side surface side thereof and which cools the power module using cooling water flowing therein; and a power supply connection module attached to the other side surface side of the water jacket and configured to connect an internal power supply path of the power module to an external power supply path of a motor unit, wherein the water jacket has a through hole passing through the water jacket from one side surface of the water jacket to the other side surface thereof, the power supply connection module includes: a connection conductor passing through the through hole and configured to connect the internal power supply path to the external power supply path; and a conductor housing configured to hold at least a part of the periphery of the connection conductor on the external power supply path side, and a seal member configured to seal the periphery of the through hole is disposed between the water jacket and the conductor housing.

According to the above aspect (1), if heat is generated in the connection conductor when a high-voltage current flows through the connection conductor, the heat is transmitted to the water jacket through the conductor housing and the seal member. The heat transmitted to the water jacket is radiated to the outside using cooling water flowing therein. Thus, the heat generated in the connection conductor is efficiently radiated to the outside through the water jacket and a decrease in durability of the conductor housing and the seal member due to heat is prevented.

(2) In the above aspect (1), three connection conductors may be provided to correspond to phases of three-phase alternating current (AC), and the three connection conductors may be held in the common conductor housing.

According to the above aspect (2), the heat generated from the three connection conductors can be transmitted to the water jacket through the common conductor housing and seal member. Therefore, when this constitution is adopted, it is possible to reduce the number of parts and it is possible to reduce the number of steps of assembling parts.

(3) In the above aspect (1) or (2), a cylindrical wall communicating with the through hole may protrude from the water jacket on the other side surface side, a protrusion section inserted into the cylindrical wall may be provided in the conductor housing, and the seal member may be disposed between an outer circumferential surface of the protrusion section and an inner circumferential surface of the cylindrical wall.

According to the above aspect (3), the seal member is in contact with a wide contact surface between the cylindrical wall on the water jacket side and the protrusion section on the conductor housing side. For this reason, it is possible to more effectively prevent dust and dirt from entering the inside of the power control unit and it is possible to improve heat transfer from the conductor housing to the water jacket through the seal member.

(4) In the above aspect (1) or (2), the conductor housing may have a base wall in contact with the other side surface of the water jacket, and the seal member may be disposed between a circumferential portion of the through hole in the other side surface of the water jacket and the base wall.

According to the above aspect (4), when the conductor housing is assembled to the water jacket, it is possible to compress the seal member with a large force. Thus, with a relatively simple constitution, it is possible to more effectively prevent dust and dirt from entering the inside of the power control unit.

(5) In any one of the above aspects (1) to (4), the connection conductor may include: a module-side bus bar connected to the internal power supply path; a motor-side bus bar connected to the external power supply path; a braided wire configured to connect the module-side bus bar to the motor-side bus bar; and at least a part of the braided wire is positioned in the through hole.

According to the above aspect (5), it is possible to prevent the generation of stress due to the error absorption of a connection section and vibrations of a vehicle by the braided wires disposed between the bus bar on the motor side and the bus bar on the module. Furthermore, heat generated in a braided wire portion is efficiently transmitted to the water jacket through an inner wall of the through hole. Therefore, when this constitution is adopted, it is possible to efficiently radiate heat in the braided wire portion, which easily generates heat, to the outside.

According to an aspect associated with the present invention, heat generated by a connection conductor can be transmitted to a water jacket through a conductor housing and a seal member and heat generated by the connection conductor can be efficiently radiated to the outside using cooling water flowing inside the water jacket. Thus, it is possible to prevent a decrease in durability of the conductor housing and the seal member due to heat.

DETAILED DESCRIPTION OF THE INVENTION

Embodiments of the present invention will be described below with reference to the drawings. Note that an arrow FR indicating a forward direction of a vehicle, an arrow UP indicating an upward direction of the vehicle, and an arrow LH indicating a leftward direction of the vehicle are shown in some of the drawings.

Figure 1:
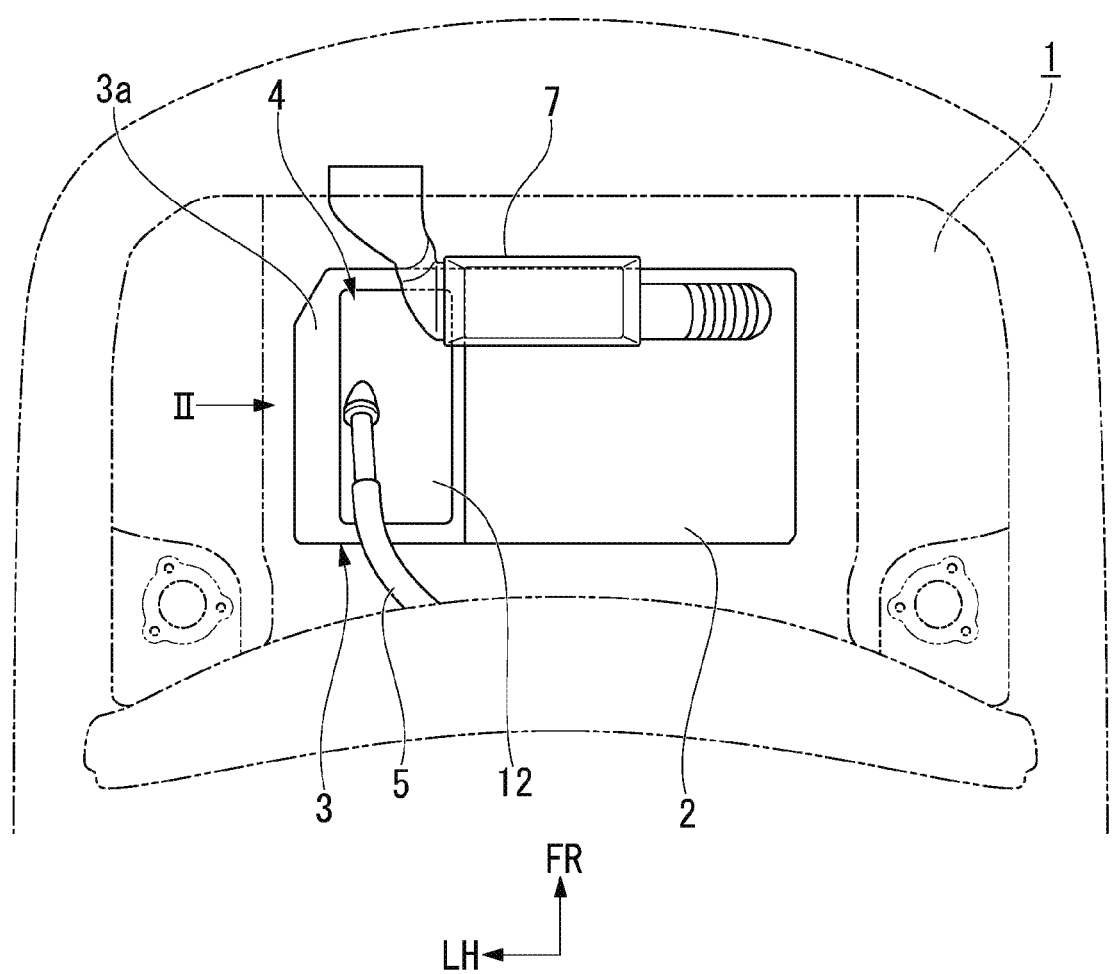
FIG. 1 is a plan view illustrating an arrangement of devices in an engine compartment of a vehicle in an embodiment.
Figure 2:
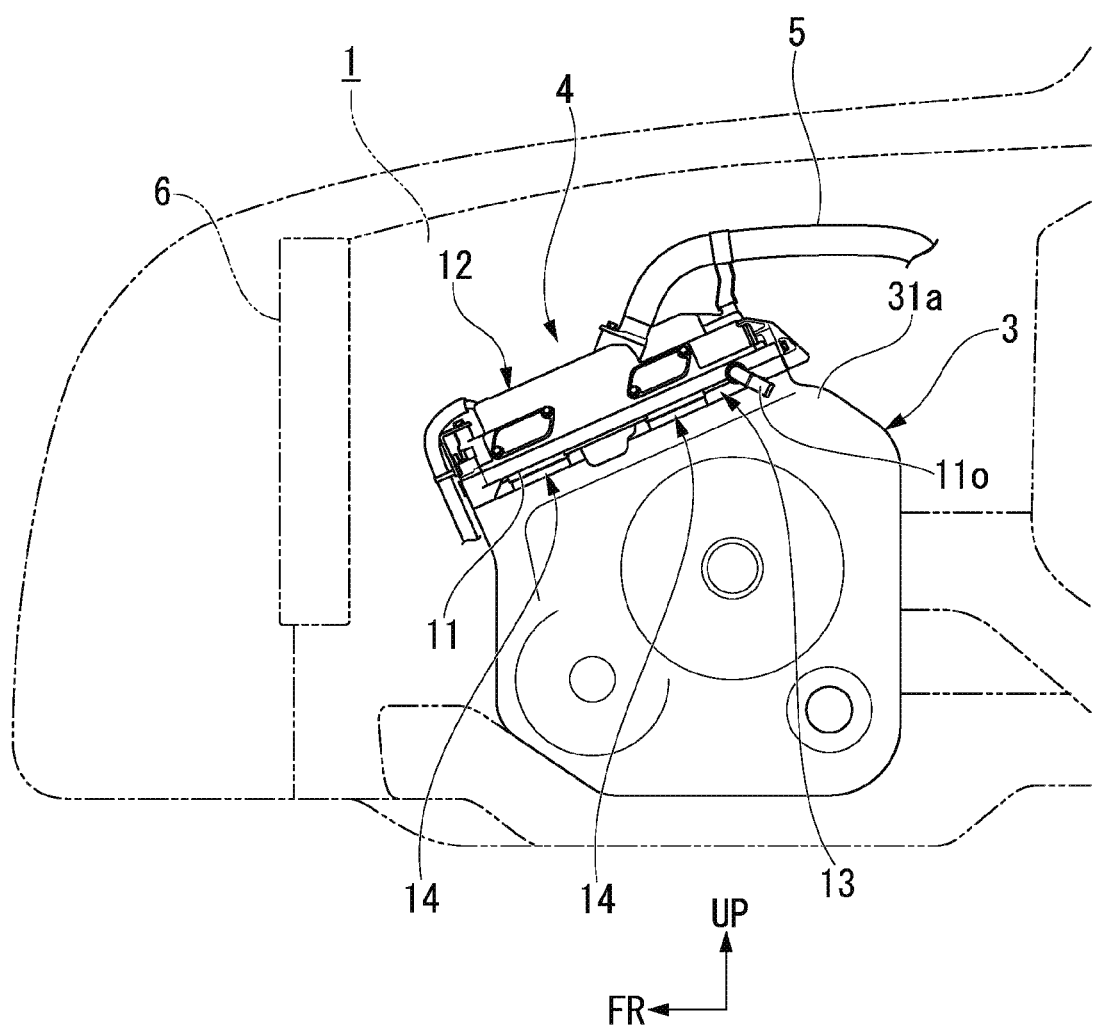
FIG. 2 is a schematic side view of the vehicle in the embodiment corresponding to an arrow II in FIG. 1.

FIG. 1 is a diagram of an engine room 1 of the vehicle when viewed from above and FIG. 2 is a schematic side view corresponding to an arrow II in FIG. 1.

An engine 2 and a motor unit 3 for driving the vehicle are installed in the engine room 1 in the vehicle. The motor unit 3 performs driving of the vehicle and regenerative power generation in accordance with a traveling state of the vehicle. The motor unit 3 is integrally joined to a side portion of the engine 2. A power control unit 4 configured to convert electric power of a high-voltage battery (not shown) into an alternating current (AC), output the AC-converted electric power to the motor unit 3, and output electric power generated by regenerative power generation using the motor unit 3 to the high-voltage battery is coupled to an upper portion of the motor unit 3. In the drawings, a high-voltage cable configured to connect the high-voltage battery (not shown) to the power control unit 4 will be denoted by reference numeral 5, a radiator will be denoted by reference numeral 6, and an air cleaner configured to filter outside air and introduce the outside air into the engine 2 will be denoted by reference numeral 7.

Figure 3:
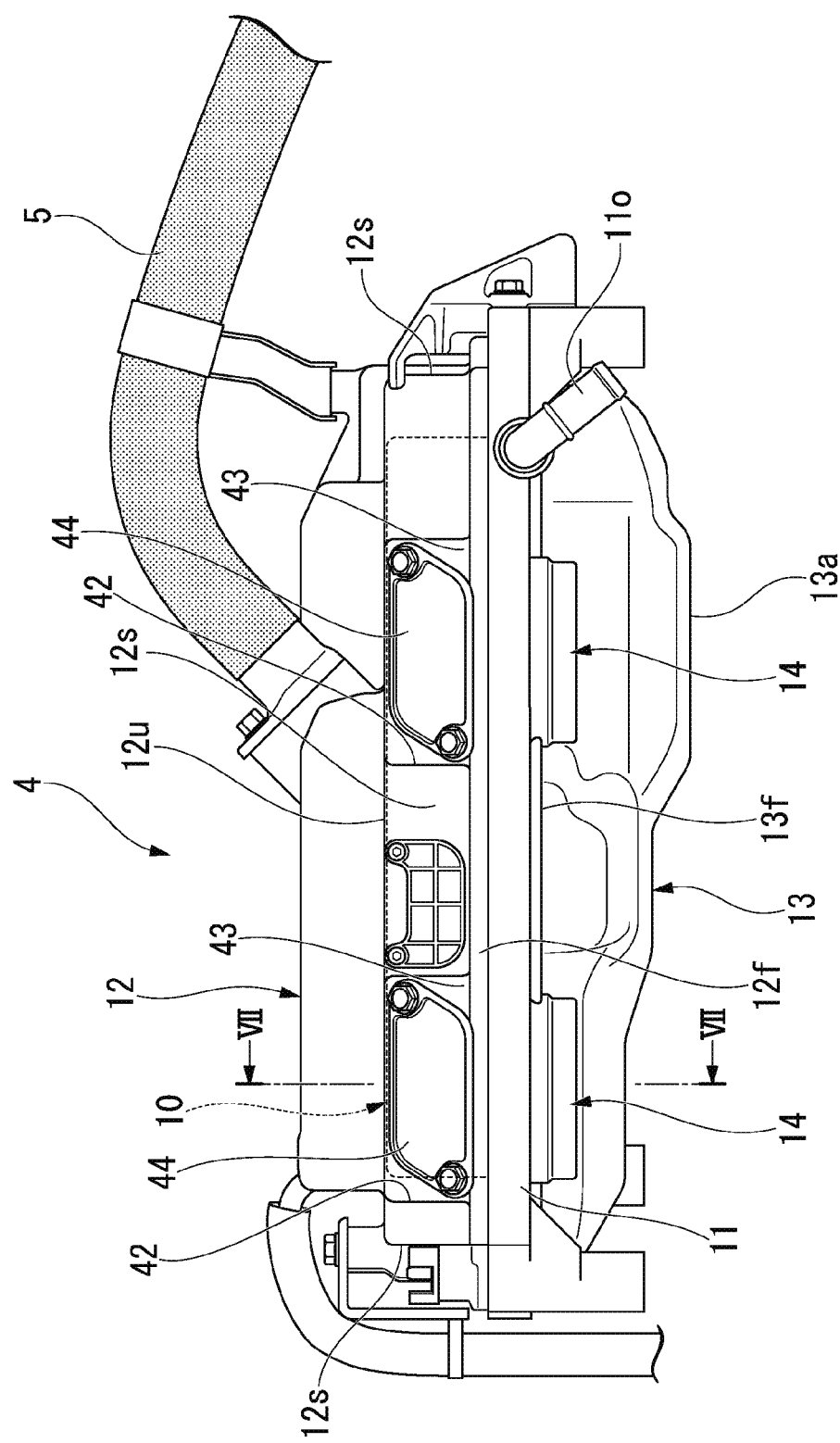
FIG. 3 is a side view of a power control unit in the embodiment.

FIG. 3 is a diagram of the power control unit 4 when viewed from the left side of the vehicle.

The power control unit 4 includes a power module 10 having functions such as an inverter and a boost converter, a water jacket 11 configured to support the power module 10 below the power module 10, an upper case 12 attached to an upper surface side of the water jacket 11 and configured to cover portions above and the periphery of the power module 10, and a lower case 13 attached to a lower surface side of the water jacket 11 and configured to cover a reactor (not shown) and the like disposed below the water jacket 11.

The power module 10 receives a control signal from a control device (not shown), converts a direct current (DC) current of the high-voltage battery into a three-phase AC current, outputs the three-phase AC current to a motor main body section of the motor unit 3, converts the three-phase AC current generated using the motor main body section into a DC current at the time of regenerative power generation, and outputs the DC current to the high-voltage battery. The power module 10 is electrically connected to the motor unit 3 using two power supply connection modules 14 (electric power supply connection sections). The two power supply connection modules 14 are a power supply connection module for driving a motor and a power supply connection module for regeneration. The two power supply connection modules 14 have the same constitution.

The two power supply connection modules 14 are attached to an upper portion of a motor block 3a (a fixed block) in the motor unit 3 to be separated in a forward/rearward direction of the vehicle. Each of the power supply connection modules 14 is attached to the upper portion of the motor block 3a in an attachable/detachable manner.

The water jacket 11 is made of a metal material having excellent thermal conductivity and cools installed devices using cooling water circulating therein. An inlet port 11i and an outlet port 11o (refer to FIG. 9) for cooling water is provided in the water jacket 11. The inlet port 11*i* and the outlet port 11*o* are connected to a circulation circuit (not shown) for cooling water.

Also, the power module 10 is attached to an upper surface side of the water jacket 11 via a module holding member 17. In the present embodiment, the module holding member 17 and the water jacket 11 constitute a support block configured to support the power module 10 below the power module 10.

A main part of the upper case 12 is integrally formed of an aluminum alloy, a heat-resistant resin, or the like. The upper case 12 mainly includes an upper wall 12*u* configured to cover a portion above the power module 10, side walls 12*s* bent from end portions of the upper wall 12*u* and extending in forward, rearward, leftward, and right directions toward the water jacket 11, and a circumferential flange 12*f* protruding outward from a lower end of the side wall 12*s*. The circumferential flange 12*f* and an upper surface of the water jacket 11 overlap and the circumferential flange 12*f* is fastened to a circumferential portion of the water jacket 11 using bolts.

The lower case 13 is integrally formed of a plate made of a metal. The lower case 13 includes a circumferential flange 13*f* (refer to FIG. 7) fastened to a lower surface of the water jacket 11 using bolts and a bulging section 13*a* bulging downward from the circumferential flange 13*f*. The bulging section 13*a* covers the outside of a storage component (not shown) such as a reactor attached to the lower surface side of the water jacket 11.

Figure 4:
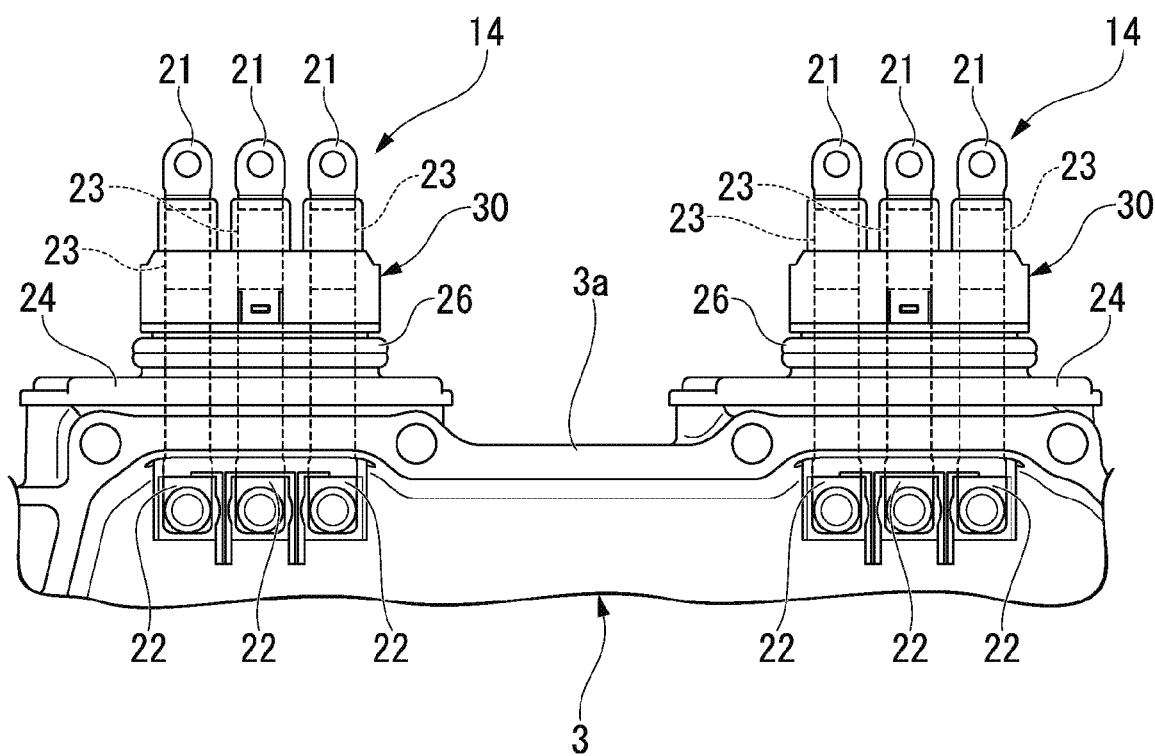
FIG. 4 is a side view of an upper portion of a motor unit in the embodiment.
Figure 5:
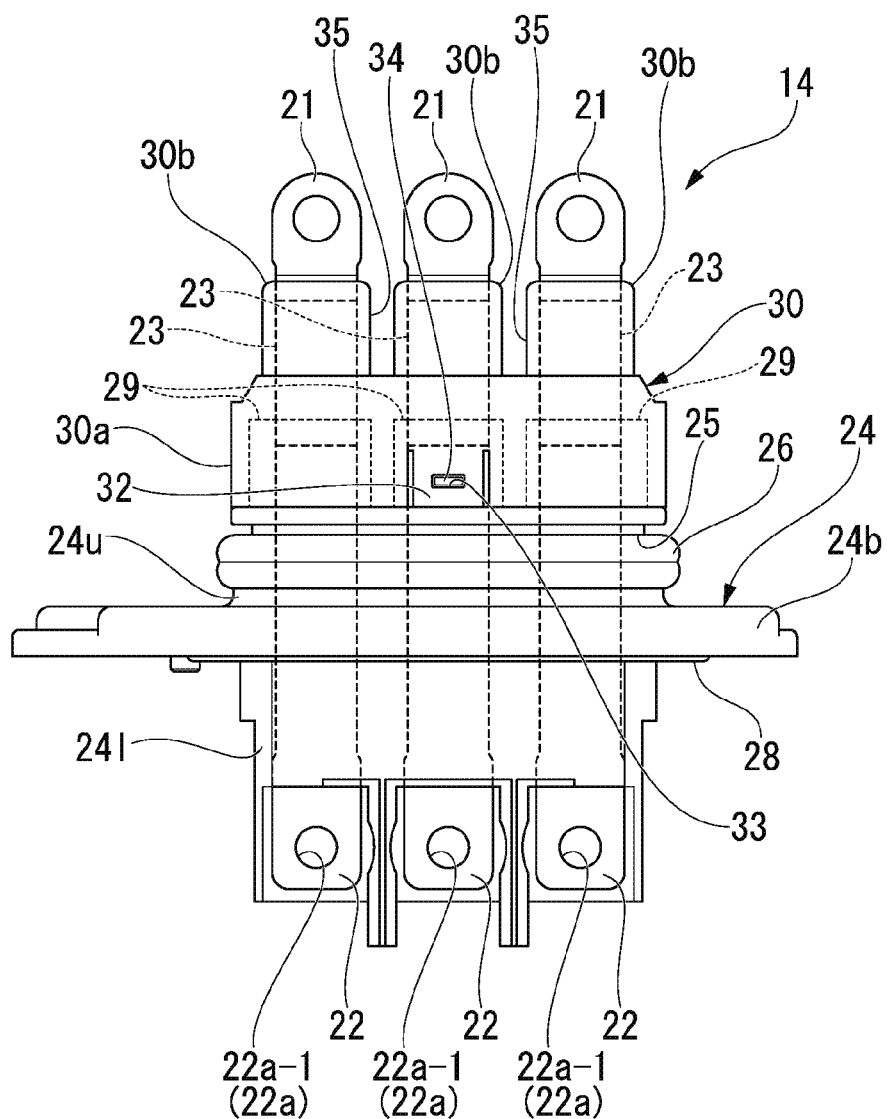
FIG. 5 is a front view of a power supply connection module in the embodiment.
Figure 6:
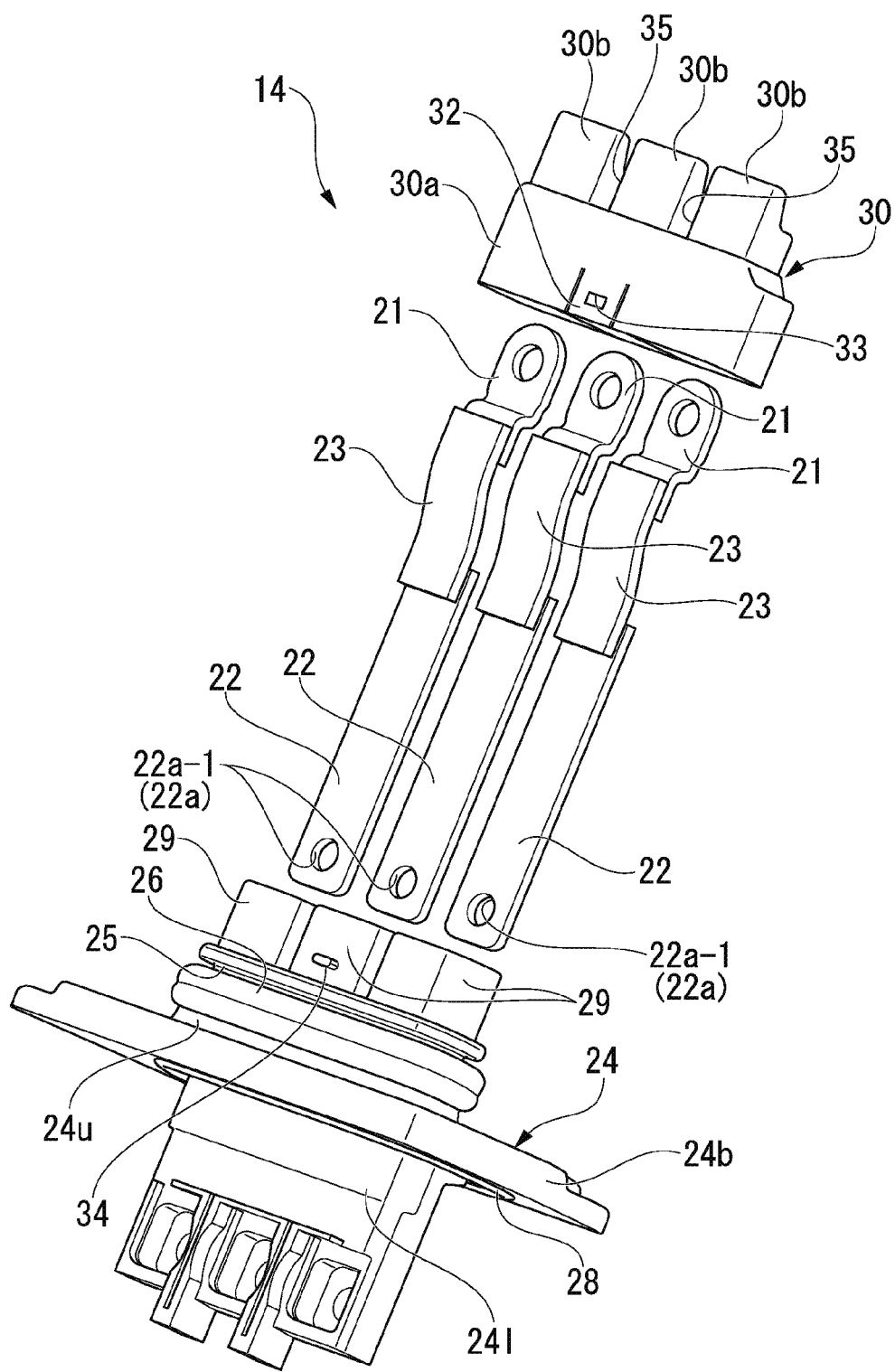
FIG. 6 is an exploded perspective view of the power supply connection module in the embodiment.
Figure 7:
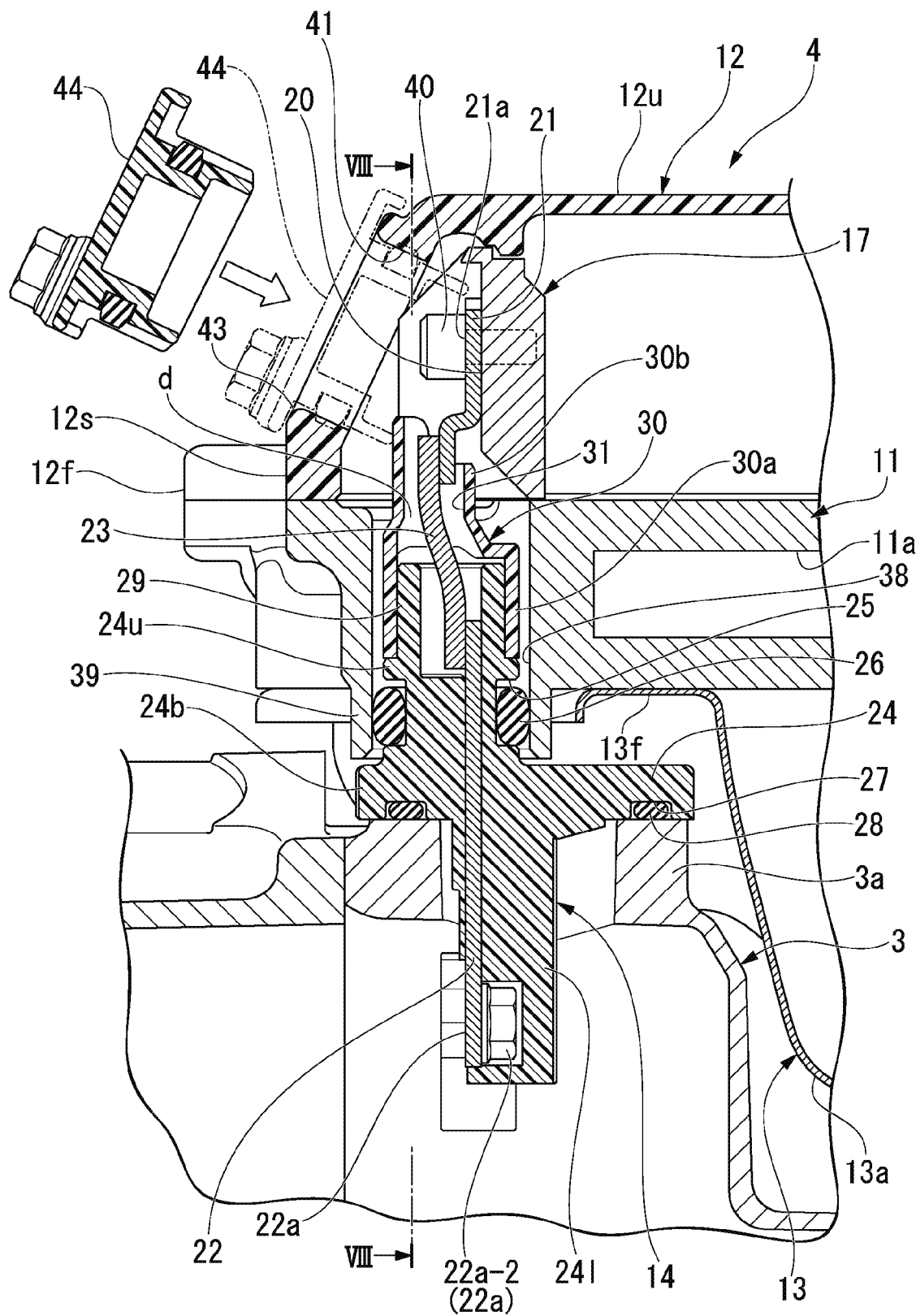
FIG. 7 is a cross-sectional view of the power control unit in the embodiment taken along line VII-VII in FIG. 3.
Figure 8:
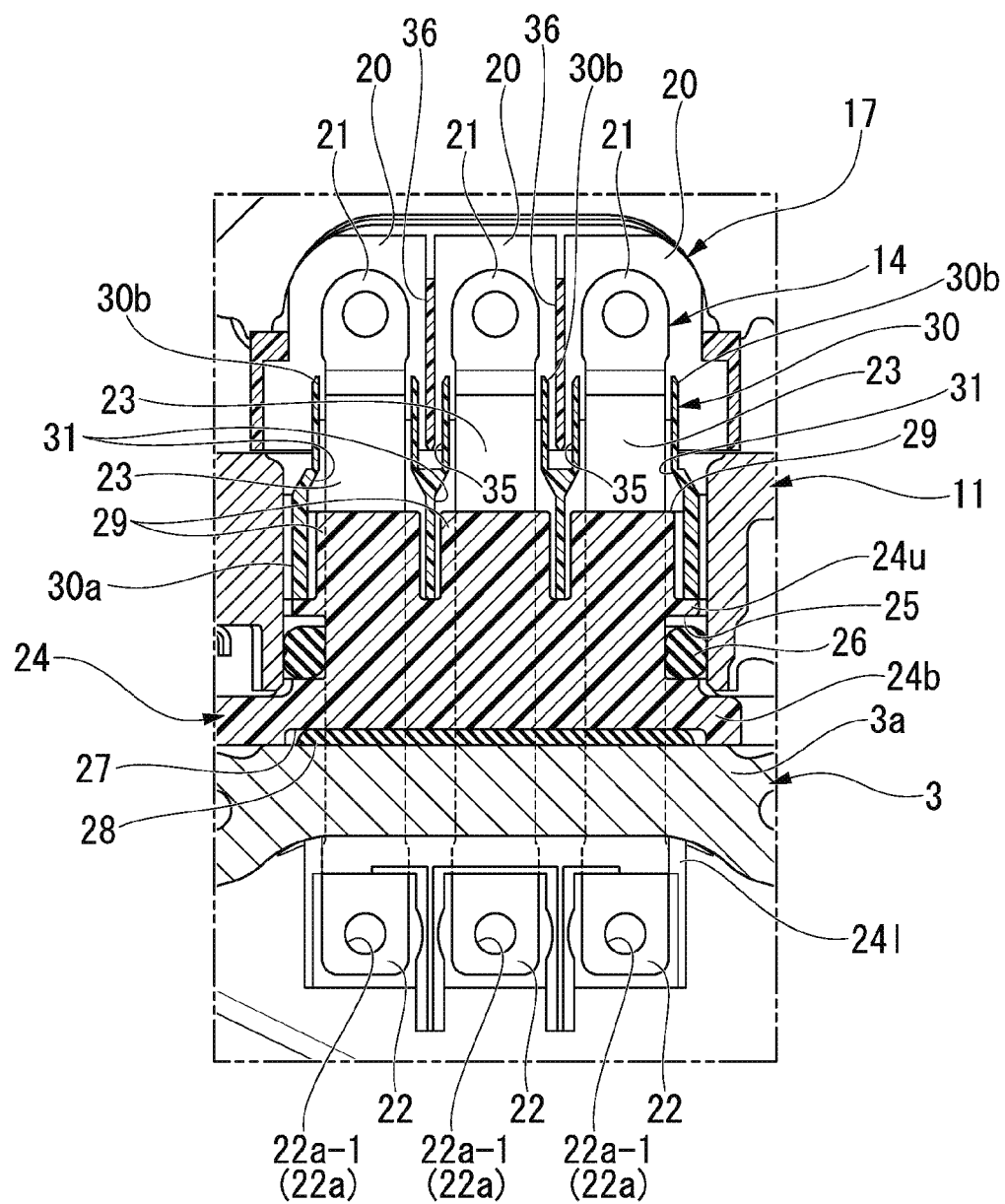
FIG. 8 is a cross-sectional view of the power control unit in the embodiment taken along line VIII-VIII in FIG. 7.

FIG. 4 is a diagram illustrating a state in which the two power supply connection modules 14 is attached to the upper portion of the motor block 3*a*. FIG. 5 is a front view of the power supply connection module 14 and FIG. 6 is an exploded perspective view of the power supply connection module 14. Furthermore, FIG. 7 is a cross-sectional view taken along line VII-VII in FIG. 3 and FIG. 8 is a cross-sectional view taken along line VIII-VIII in FIG. 7. The two power supply connection modules 14 are connected to the inside of the power control unit 4 in substantially the same manner. In addition, structures of connection sections in the power control unit 4 corresponding to the power supply connection modules 14 are the same.

As illustrated in FIGS. 7 and 8, internal power supply paths 20 connected to the power supply connection module 14 are provided in the module holding member 17 configured to hold the power module 10. Three internal power supply paths 20 are provided to correspond to each of the power supply connection modules 14. Similarly, three external power supply paths (not shown) are provided at the motor block 3*a* side of the motor unit 3 to correspond to each of the power supply connection modules 14.

As illustrated in FIGS. 4 and 5, the power supply connection module 14 includes three module-side bus bars 21 connected to the internal power supply paths 20 on the power module 10 side, three motor-side bus bars 22 connected to the external power supply paths on the motor unit 3 side, three braided wires 23 configured to connect the module-side bus bars 21 of a corresponding phase to the motor-side bus bars 22 of a corresponding phase, and a bus bar housing 24 (a conductor housing) made of an insulating resin and configured to hold the three motor-side bus bars 22.

Each of the module-side bus bars 21 and each of the motor-side bus bars 22 are formed of a conductive metal plate having a predetermined thickness.

Each of the braided wires 23 is formed by, for example, braiding a plurality of copper wires. The braided wires 23 can easily deform the module-side bus bars 21 and the motor-side bus bars 22 in various directions and efficiently radiate heat generated due to electrical conduction to the outside.

In the present embodiment, the module-side bus bar 21, the braided wire 23, the motor-side bus bar 22 constitute a connection conductor configured to connect the internal power supply paths 20 on the power module 10 side to the external power supply path on the motor unit 3 side.

As illustrated in FIGS. 5 and 6, the bus bar housing 24 includes a plate-like base wall 24*b* which overlaps an upper surface (refer to FIG. 4) of the motor block 3*a* and is fastened to the upper surface of the motor block 3*a* using bolts, a downwardly protruding section 241 protruding downward from the base wall 24*b*, and an upwardly protruding section 24*u* (a protrusion section) protruding upward from the base wall 24*b*. The three motor-side bus bars 22 are held by the downwardly protruding section 241, the base wall 24*b*, and the upwardly protruding section 24*u* while separated from each other. The three motor-side bus bars 22 are held by the bus bar housing 24 so that a longitudinal direction thereof is directed in an upward/downward direction and the three motor-side bus bars 22 are arranged side by side in a line. Furthermore, a lower end portion of each of the motor-side bus bars 22 is exposed to the outside from a side surface near a lower end of the downwardly protruding section 241. A connection fixing section 22*a* fastened to the external power supply path in the motor unit 3 using bolts is provided in a lower end portion of the motor-side bus bars 22. In the present embodiment, the connection fixing section is constituted of a bolt insertion hole 22*a*-1 and a weld nut 22*a*-2.

An annular holding groove 25 whose upward/downward width is larger than its dimension in a depth direction is formed in an outer circumferential surface of the upwardly protruding section 24*u* on a base portion side in the bus bar housing 24. A substantially elliptical seal ring 26 (a seal member) whose cross section is long in an upward/downward direction is installed in the holding groove 25. The seal ring 26 seals between the bus bar housing 24 and the water jacket 11 which will be described later. Furthermore, an annular groove 27 is formed in a lower surface of the base wall 24*b* and a seal ring 28 configured to seal between the lower surface of the base wall 24*b* and an upper surface of the motor block 3*a* is installed in the annular groove 27.

Three cylindrical sections 29 configured to independently cover the periphery of the three motor-side bus bars 22 at upper end side thereof protrude at an upper end side of the upwardly protruding section 24*u* of the bus bar housing 24. An integral insulating cover member 30 made of an insulating resin material is attached to the three cylindrical sections 29 in an attachable/detachable manner. The insulating cover member 30 constitutes each of the power supply connection modules 14 together with the module-side bus bar 21, the motor-side bus bar 22, the braided wire 23, and the bus bar housing 24, and the like.

The insulating cover member 30 includes a lower block 30*a* fitted to the three cylindrical sections 29 of the bus bar housing 24 from above and three tubular sections 30*b* projecting upward from an upper portion of the lower block 30*a*. Insertion through holes 31 which pass through the lower block 30*a* and each of the tubular sections 30*b* in an upward/downward direction and are continuous are formed in the lower block 30*a* and each of the tubular sections 30*b*. A lower end of each of the insertion through holes 31 disposed in the lower block 30*a* is fitted to each of the cylindrical sections 29 of the bus bar housing 24. The braided wire 23 of a corresponding phase and a part of the module-side bus bar 21 on a lower portion side thereof are disposed in each of the tubular sections 30b in a state of being inserted.

As illustrated in FIG. 7, when the insulating cover member 30 is assembled to an upper portion of the bus bar housing 24, the periphery of a connection section between an upper portion of the motor-side bus bar 22 of each phase and the braided wire 23 is directly covered with each of the cylindrical sections 29 of the bus bar housing 24. Furthermore, at this time, the periphery of a connection section between the braided wire 23 of each phase and the lower portion of the module-side bus bar 21 is directly covered with a circumferential wall of the corresponding insertion through hole 31 of the insulating cover member 30. Therefore, a lower portion side of the braided wire 23 is covered with the insulating cover member 30 so that the cylindrical section 29 of the bus bar housing 24 is disposed between the lower portion side of the braided wire 23 and the insulating cover member 30. In addition, an upper portion side of the braided wire 23 is directly covered with the insulating cover member 30. As illustrated in FIG. 7, the insulating cover member 30 and each of the cylindrical sections 29 surround the periphery of the braided wire 23 and the module-side bus bar 21 with a gap d therebetween.

In the present embodiment, a wall of each of the tubular sections 30b of the insulating cover member 30 forms a partition wall configured to partition between neighboring braided wires 23.

Each of the tubular sections 30b of the insulating cover member 30 assembled to the bus bar housing 24 extends to a position at which an upper end portion thereof faces at least a part of the module-side bus bar 21. For this reason, the insulating cover member 30 can reliably restrict the falling of the module-side bus bar 21 due to the deformation of the braided wire 23 using each of the tubular sections 30b.

Here, even if the insulating cover member 30 has a height in which the insulating cover member 30 does not reach the position at which the insulating cover member 30 faces the module-side bus bar 21, when a structure in which the periphery of the braided wire 23 is surrounded is provided, it is possible to restrict the deformation of the module-side bus bar 21 to a certain extent.

Also, as illustrated in FIG. 6 and the like, a tongue piece 32 which can be bent and deformed using a cutout is formed in a wall of a lower edge of the lower block 30a of the insulating cover member 30. A locking hole 33 passing through the tongue piece 32 in a thickness direction thereof is formed in the tongue piece 32. On the other hand, a protrusion 34 which can be fitted into the locking hole 33 is provided on an outer surface of the cylindrical section 29 of the bus bar housing 24. When the insulating cover member 30 is fitted to the cylindrical section 29 of the bus bar housing 24, the protrusion 34 bends the tongue piece 32 and is fitted into the locking hole 33. Thus, the insulating cover member 30 is prevented from coming off with respect to the bus bar housing 24.

Also, as illustrated in FIGS. 5 and 8, the insulating cover member 30 of the present embodiment and an adjacent tubular section 30b form a concave section 35 in which the upper surface of the lower block 30a is open upward.

The concave section 35 separates peripheral portions of adjacent module-side bus bars 21 and each displacement restricting section 36 protruding from the module holding member 17 is inserted into the concave section 35 when the power supply connection module 14 is assembled to the power control unit 4. The displacement restricting section 36 restricts the displacement of the insulating cover member 30 when inserted into the concave section 35 of the insulating cover member 30.

Figure 9:
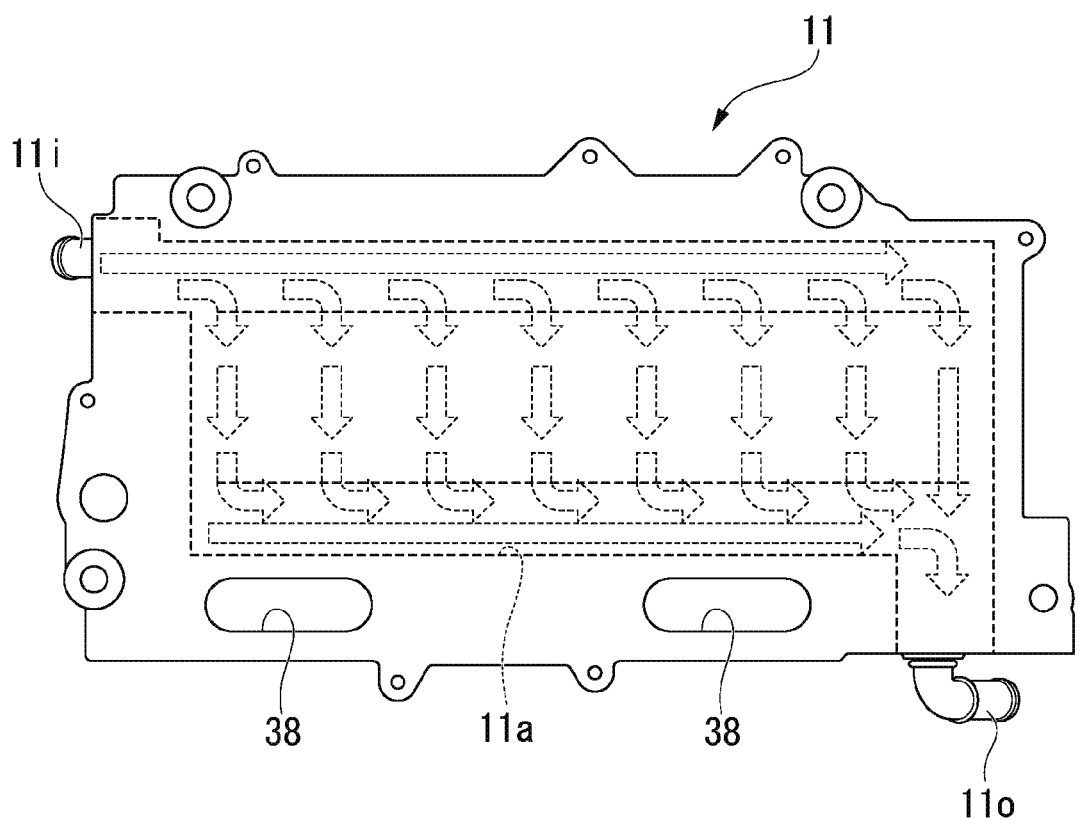
FIG. 9 is a plan view of a water jacket in the embodiment.

FIG. 9 is a diagram of the water jacket 11 when viewed from above.

The water jacket 11 is formed in a substantially rectangular shape when viewed in a plan view, has the inlet port 11i for cooling water disposed in a front surface near an end in a longitudinal direction, and has the outlet port 11o disposed in a side surface near the other end thereof in the longitudinal direction. A cooling passage 11a through which cooling water flows from the inlet port 11i toward the outlet port 11o is formed inside the water jacket 11. A pair of through holes 38 passing through the water jacket 11 from above to below are formed at positions adjacent to the cooling passage 11a on one side of the water jacket 11. Each of the through holes 38 is formed in a long hole shape in which the through hole 38 extends in the longitudinal direction of the water jacket 11.

Also, as illustrated in FIG. 7, a cylindrical wall 39 projecting downward protrudes from a lower edge portion of each of the through holes 38 of the water jacket 11. An inner circumferential surface of the cylindrical wall 39 is continuous with the through hole 38. A part of the power supply connection module 14 is inserted into the cylindrical wall 39 and the through hole 38 from below. To be specific, a side portion above the base wall 24b of the bus bar housing 24, the insulating cover member 30 assembled to the bus bar housing 24, and upper regions of three-phase connection conductors (the module-side bus bar 21, the braided wire 23, and the motor-side bus bar 22) held therein are inserted into the cylindrical wall 39 and the through hole 38. At this time, the seal ring 26 attached to the upwardly protruding section 24u of the bus bar housing 24 comes into close contact with the inner circumferential surface of the cylindrical wall 39 while being elastically deformed. The seal ring 26 is in contact with the inner circumferential surface of the cylindrical wall 39 and an inner wall of the holding groove 25 of the upwardly protruding section 24u and seals therebetween. As a result, the lower side periphery of the through hole 38 of the water jacket 11 is closed by the seal ring 26. The seal ring 26 transmits heat toward a main body side of the water jacket 11 through the cylindrical wall 39. For this reason, the heat transmitted from the three-phase connection conductors to the seal ring 26 is radiated to the water jacket 11.

The bus bar housing 24 has the base wall 24b fastened and fixed to the lower surface of the water jacket 11 using bolts or the like. Furthermore, the braided wire 23 of each phase is positioned inside the through hole 38.

Figure 10:
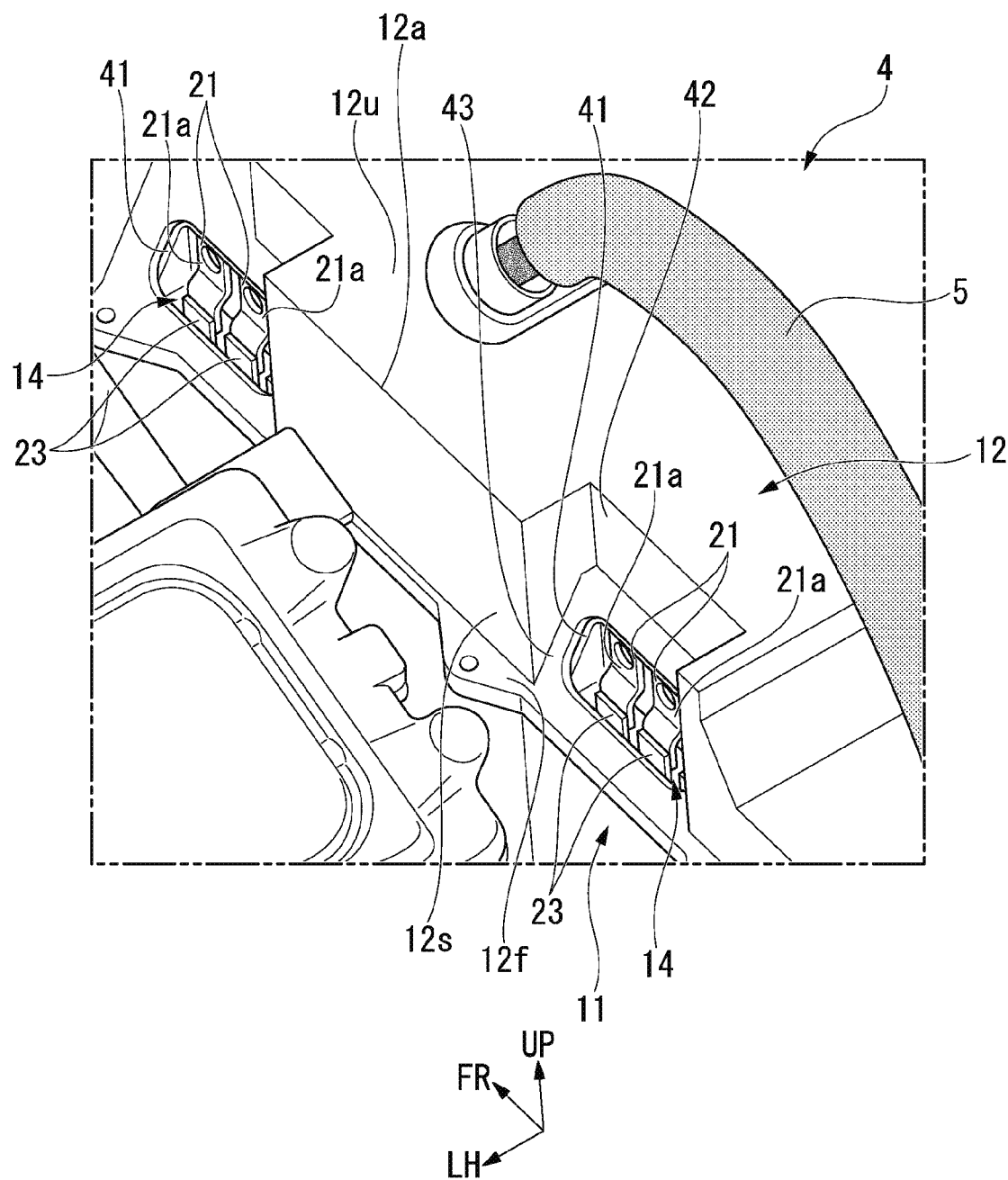
FIG. 10 is a perspective view of the engine room in the power control unit in the embodiment.

When a part of the power supply connection module 14 is inserted into the cylindrical wall 39 and the through hole 38 as described above, the falling of the module-side bus bar 21 due to the bending of the braided wire 23 is restricted by the insulating cover member 30. Furthermore, when the power supply connection module 14 is assembled to the water jacket 11 as described above, the connection fixing section 21a at an upper end of the module-side bus bars 21 of the power supply connection module 14 is disposed at a position facing the internal power supply path 20 corresponding to the module holding member 17. As illustrated in FIG. 7, the connection fixing section 21a of each of the module-side bus bars 21 is connected to the corresponding internal power supply path 20 through fastening with a bolt 40. The fastening of the connection fixing section 21a by the bolt 40 (a fastening member) is performed using an operating tool through an opening portion 41 provided in the upper case 12. The opening portion 41 is disposed at a position in the upper case 12 where the opening portion 41 faces the connection fixing section 21a of the module-side bus bar 21 from an oblique upper side. FIG. 10 is a diagram of the power control unit 4 disposed in the engine compartment 1 when viewed from a rear left oblique upper part.

As illustrated in FIG. 10, two concave sections 42 formed in a side edge 12a of the upper case 12 are disposed between the upper wall 12u and the side wall 12s (a side wall facing outward in a vehicle width direction) of the upper case 12 and have a substantially right-angle cross section such that a corner of the side edge 12a is cut out. A bottom wall of the concave section 42 is constituted of an inclined wall 43 inclined downward from a center side of the upper wall 12u in a direction of the side wall 12s. The above-described opening portion 41 used for fastening the connection fixing section 21a and the like is formed in the inclined wall 43. The inclined wall 43 is formed at a position where the inclined wall 43 faces the connection fixing section 21a from an oblique upper side.

The opening portion 41 is formed in a shape or size that allows a head portion of the bolt 40 serving as a fastening member or the connection fixing section 21a to be viewed in a front view orthogonal to the inclined wall 43. Furthermore, since the opening portion 41 is for performing an attachment/detachment operation of the bolt 40 serving as a fastening member, the opening portion 41 is formed to have a size that allows the insertion of the bolt 40 and a distal end portion of the operating tool.

Also, since the through hole 38 of the water jacket 11 is disposed below the opening portion 41 of the upper case 12 as illustrated in FIG. 7, it is necessary to prevent the bolt 40 from falling out of the through hole 38 at the time of attaching/detaching the bolt 40. In the present embodiment, since the insulating cover member 30 is disposed to fill a gap between the through hole 38 and the connection conductors (the module-side bus bar 21 and the braided wire 23), it is possible to prevent the bolt 40 from falling out of the through hole 38.

Also, as illustrated in FIG. 7, the opening portion 41 provided in each of the inclined walls 43 is normally closed using a lid member 44. The lid member 44 is attached to the corresponding inclined wall 43 by screw-coupling or the like in an attachable/detachable manner and is removed from the inclined wall 43 when necessary, such as at the time of maintenance.

Furthermore, as illustrated in FIG. 10, the high-voltage cable 5 connected to a high voltage circuit including a capacitor in the upper case 12 is drawn out of an upper portion of the upper case 12. The high-voltage cable 5 is routed at a position in which the high-voltage cable 5 bypasses each inclined wall 43 above the upper wall 12u of the upper case 12.

As described above, the seal structure of the power control unit of the present embodiment can transmit heat generated by the connection conductor in the power supply connection module 14 to the water jacket 11 through the bus bar housing 24 and the seal ring 26. For this reason, it is possible to efficiently radiate heat of the connection conductor to the outside through cooling water flowing inside the water jacket 11. Therefore, when the seal structure of the present embodiment is adopted, it is possible to prevent a decrease in durability of the bus bar housing 24 and the seal ring 26 due to heat.

Also, in the seal structure of the present embodiment, the bus bar housing 24 holds three connection conductors and the bus bar housing 24 configured to hold the three connection conductors is in contact with the water jacket 11 via one seal ring 26. Therefore, when this constitution is adopted, it is possible to improve the performance of the seal structure with a small number of parts and it is possible to reduce man-hours for assembling parts.

Also, in the seal structure of the present embodiment, the cylindrical wall 39 protrudes from the lower surface of the water jacket 11 and the upwardly protruding section 24u inserted into the cylindrical wall 39 protrudes from the upper portion of the bus bar housing 24. Furthermore, the seal ring 26 is disposed between the outer circumferential surface of the upwardly protruding section 24u and the inner circumferential surface of the cylindrical wall 39. For this reason, the seal ring 26 configured to transmit heat in the power supply connection module 14 comes into contact with a large area between the upwardly protruding section 24u and the cylindrical wall 39. Therefore, when this constitution is adopted, it is possible to more effectively prevent dust and dirt from entering the inside of the power control unit 4 and it is possible to improve heat transmission from the bus bar housing 24 to the water jacket 11 through the seal ring 26.

Also, in the power supply connection module 14 of the present embodiment, the connection conductor is constituted by connecting the module-side bus bar 21 and the motor-side bus bar 22 with the braided wire 23. For this reason, it is possible to prevent the absorption of an error at the connection section of the power supply connection module 14 and the generation of stress due to the vibrations of the vehicle by the braided wire 23. In addition, in the present embodiment, at least a part of the braided wire 23 which easily generates heat at the time of electric conduction is disposed inside the through hole 38 in the water jacket 11. For this reason, it is possible to efficiently radiate high-temperature heat generated in a portion of the braided wire 23 to the water jacket 11 through an inner wall of the through hole 38.

Figure 11:
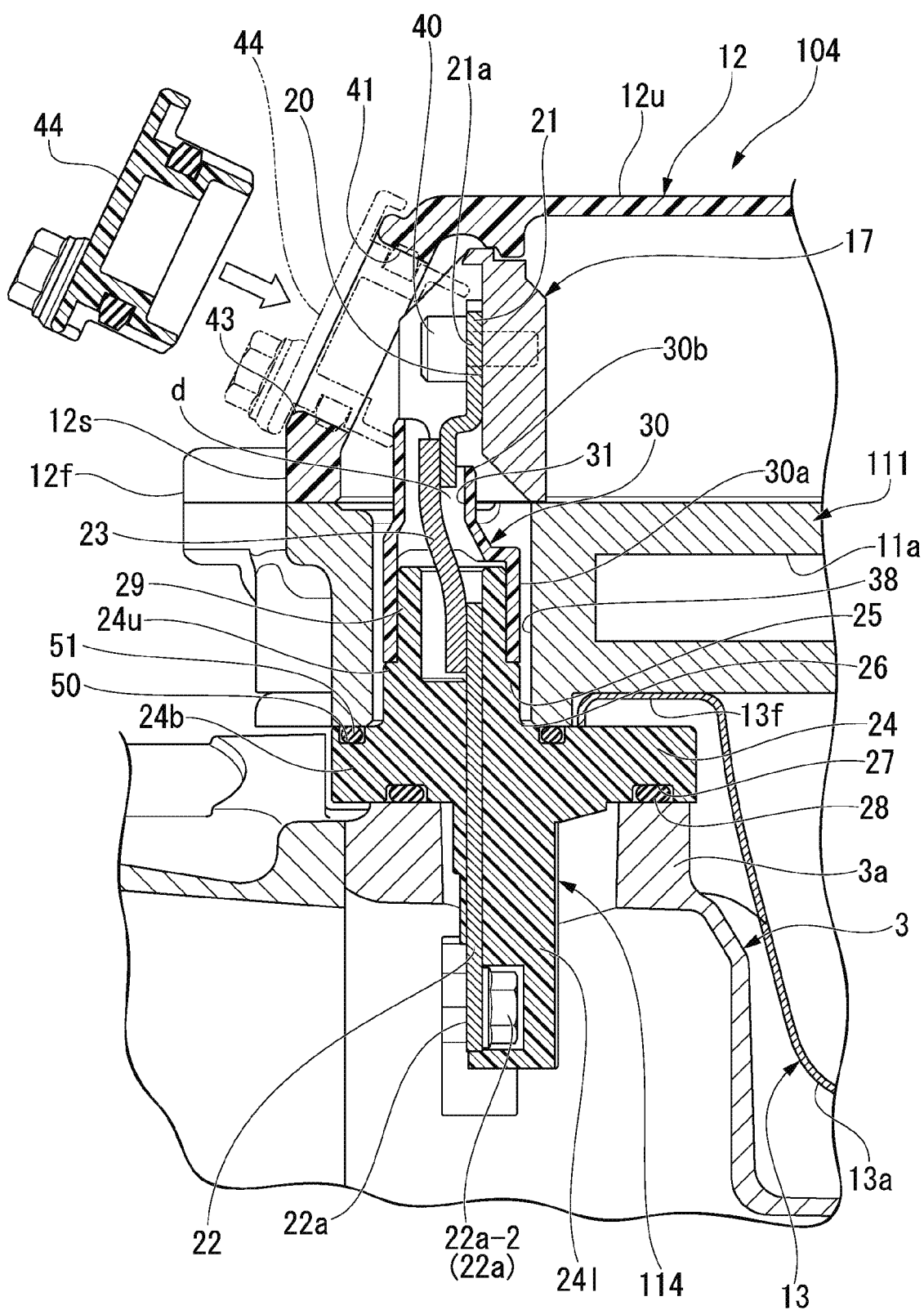
FIG. 11 is a cross-sectional view of a power control unit in another embodiment as in FIG. 7.

FIG. 11 is a cross-sectional view of another embodiment similar to FIG. 7 associated with the embodiment. Constituent elements in FIG. 11 that are the same as those of the above-described embodiment will be denoted by the same reference numerals of the above-described embodiment. Furthermore, a power control unit in FIG. 11 will be denoted by reference numeral 104 and a power supply connection module will be denoted with reference numeral 114.

Although the seal structure of the present embodiment has the same basic constitution as that of the above-described embodiment, a seal ring 51 (a seal member) is disposed between an upper surface of a base wall 24b of a bus bar housing 24 and a lower surface of a water jacket 111 in a state in which a cylindrical wall is not provided on a lower surface of a water jacket. The seal ring 51 is held in an annular groove 50 formed in the upper surface of the base wall 24b.

In the seal structure of the present embodiment, when the bus bar housing 24 is assembled to the water jacket 111 through fastening with bolts or the like, it is possible to compress the seal ring 51 with a large force. For this reason, although a relatively simple constitution is provided, it is possible to more effectively prevent dust and dirt from entering the inside of a power control unit 104.

The present invention is not limited to the above-described embodiments and various design changes are possible without departing from the gist of the present invention.

What is claimed is:

1. A seal structure of a power control unit, comprising:
a power module;

a water jacket in which the power module is disposed on one surface thereof and which cools the power module using cooling water flowing therein; and a power supply connection module attached to another surface of the water jacket and configured to connect an internal power supply path of the power module to an external power supply path of a motor unit, wherein the water jacket has a through hole passing through the water jacket from the one surface of the water jacket to the another surface thereof, the power supply connection module includes:

a connection conductor passing through the through hole and configured to connect the internal power supply path to the external power supply path; and a conductor housing configured to hold at least a part of the periphery of the connection conductor on a side of the external power supply path, and a seal member configured to seal the periphery of the through hole is disposed between the water jacket and the conductor housing.

2. The seal structure of the power control unit according to claim 1, wherein the connection conductor includes three connection conductors provided to correspond to phases of three-phase alternating current (AC), and the three connection conductors are held in the conductor housing.

3. The seal structure of the power control unit according to claim 1, wherein a cylindrical wall communicating with the through hole protrudes from the another surface of the water jacket, a protrusion section inserted into the cylindrical wall is provided in the conductor housing, and the seal member is disposed between an outer circumferential surface of the protrusion section and an inner circumferential surface of the cylindrical wall.

4. The seal structure of the power control unit according to claim 1, wherein the conductor housing has a base wall in contact with the another surface of the water jacket, and the seal member is disposed between a circumferential portion of the through hole in the another surface of the water jacket and the base wall.

5. The seal structure of the power control unit according to claim 1, wherein the connection conductor includes:

a module-side bus bar connected to the internal power supply path;

a motor-side bus bar connected to the external power supply path;

a braided wire configured to connect the module-side bus bar to the motor-side bus bar; and at least a part of the braided wire is positioned in the through hole.

* * * * *